United States Patent
Jung et al.

(10) Patent No.: US 7,562,446 B2
(45) Date of Patent: *Jul. 21, 2009

(54) METHOD FOR MANUFACTURING SUBSTRATE WITH CAVITY

(75) Inventors: Hoe-Ku Jung, Daejeon (KR);
Myung-Sam Kang, Daejeon (KR);
Jung-Hyun Park, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 282 days.

This patent is subject to a terminal disclaimer.

(21) Appl. No.: 11/524,403

(22) Filed: Sep. 21, 2006

(65) Prior Publication Data

US 2007/0065988 A1 Mar. 22, 2007

(30) Foreign Application Priority Data

Sep. 22, 2005 (KR) .................. 10-2005-0088091

(51) Int. Cl.
*H05K 3/02* (2006.01)
*H05K 3/10* (2006.01)

(52) U.S. Cl. ................ 29/846; 29/831; 29/832; 29/852; 174/255

(58) Field of Classification Search .......... 29/830–832, 29/846, 852; 174/250, 262; 438/118, 687
See application file for complete search history.

(56) References Cited

U.S. PATENT DOCUMENTS 5,116,440 A 5/1992 Takeguchi et al.
5,495,665 A * 3/1996 Carpenter et al. ............ 29/830
5,505,321 A * 4/1996 Caron et al. ................ 174/250
2001/0041386 A1 11/2001 Yasunaga
2003/0006501 A1 1/2003 Waki et al.

OTHER PUBLICATIONS

German Patent Office Action, mailed Sep. 17, 2008 and issued in corresponding German Patent Application No. 10 2006 044 368.3-33.

* cited by examiner

*Primary Examiner*—Donghai D. Nguyen (57) ABSTRACT

A method for manufacturing a substrate having a cavity is disclosed. The method comprises: (a) forming a first circuit patter on both sides of a seed layer by use of a first dry film, the seed layer being for forming a circuit pattern on both sides; (b) laminating a second dry film on the first dry film on both sides of the seed layer, the thickness of the second dry film corresponding to the depth of the cavity to be formed; (c) laminating a dielectric layer on an area outside of where the cavity is to be formed on both sides of the seed layer, the thickness of the dielectric layer corresponding to the depth of the cavity to be formed; (d) laminating on the seed layer a copper foil laminated master having a second circuit pattern; and (e) forming the cavity by peeling off the first dry film and the second dry film after removing the seed layer. The method for manufacturing a substrate with a cavity in accordance with the present invention can improve the efficiency of a substrate manufacturing process by using both sides of a seed layer to manufacture the substrate with a cavity.

12 Claims, 8 Drawing Sheets

FIG. 1

(PRIOR ART)

METHOD FOR MANUFACTURING SUBSTRATE WITH CAVITY

BACKGROUND OF THE INVENTION

1. Field of the Invention

The present invention relates to a stacked-type semiconductor package module, more specifically to a method for manufacturing a substrate, on which a cavity is formed.

2. Description of the Related Art

With the development of the electronics industry, there has been increasing demands for electronic parts that perform better and are smaller. To accommodate these demands, the semiconductor packing technologies have been evolving from packing one integrated circuit on one substrate to packing several integrated circuits on one substrate. Moreover, to address the need for realizing high-performance, high-density packages, and to meet the demand for these packages, the "package on package (POP)" technology has been introduced. However, minimizing the thickness of the package has been a challenge to overcome for successful implementation of the POP technology.

Figure 1:
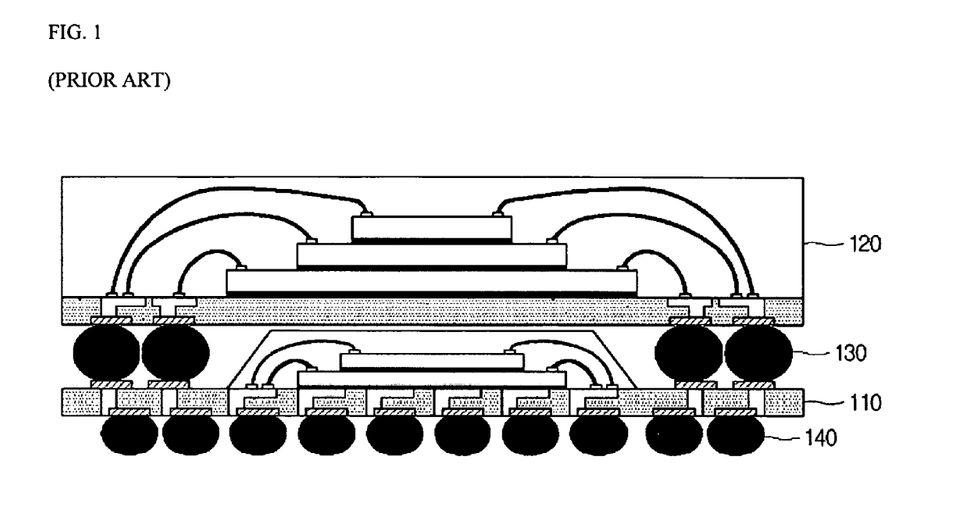
FIG. 1 shows a sectional view of a package on package in accordance with the prior art.

FIG. 1 is a sectional view of a package on package in accordance with the prior art. FIG. 1 shows a lower package 110, an upper package 120, an upper solder ball 103, and a lower solder ball 140.

The conventional ball grid array (BGA) semiconductor package has a substrate body, in which a plurality of patterned conductive wires are installed. On top of the substrate body are a plurality of chip pads, to which semiconductor chips are wire-bonded. In addition, some area of the top of the substrate body is molded with an epoxy compound and forms a molding part, such that the semiconductor chip and metal wire are enveloped. Adhered to the bottom of the substrate are a plurality of solder balls such that the other ends of the conductive wires installed in the substrate can be connected. This structure of a conventional ball grip array semiconductor package is too thick to be stacked as a highly integrated memory module within a limited area.

The lower package 110 of the conventional package on package has a dual-level structure, and an integrated circuit is mounted on the surface of this substrate. The substrate of the lower package 110 is manufactured in the same method as manufacturing a general printed circuit board. The increasing density in the semiconductor package module necessitates the mounting of a plurality of integrated circuits. With the conventional method, it is difficult to increase the mounting in the lower package 110 while maintaining the overall height of the package on package. The die-thinning method, which reduces the thickness of a semiconductor chip, can be one way of reducing the height, but this raises the issue of function-error with a prolonged operation. Therefore, improvement in mounting capacity of the package on package is attempted by reducing the thickness of the substrate.

Since there are limitations to how thin the substrate can be made, the number of integrated circuits that can be mounted in the lower semiconductor package is also limited. Besides, embedding a semiconductor package in the substrate requires a drilling process, which is complicated and costly.

While only one side of a seed layer has been used when manufacturing the substrate in the prior art, use of more than one side of the seed layer is increasingly needed for a more efficient manufacturing process.

SUMMARY OF CERTAIN INVENTIVE ASPECTS

The present invention features a method for manufacturing a substrate with a cavity that manufactures a package on package substrate, on which a plurality of integrated circuits can be mounted by reducing the thickness of the substrate.

The present invention also provides a method for manufacturing a substrate with a cavity that can reduce the overall thickness of the semiconductor package by mounting the integrated circuits in the cavity.

The present invention also provides a method for manufacturing a substrate with a cavity that can simplify the process by mounting the integrated circuits in the cavity formed on the substrate, without using a separate drilling process.

Moreover, the present invention provides a method for manufacturing a substrate with a cavity that can make the package relatively thinner than other packages, on which the same number of integrated circuits are mounted, by incorporating the integrated circuits in the cavity formed on the substrate.

Furthermore, the present invention provides a method for manufacturing a substrate with a cavity that has a better finishing process than the conventional cavity-forming process by forming the cavity without using a separate drilling process.

The present invention also provides a method for manufacturing a substrate with a cavity that can mount multiple layers of a plurality of integrated circuits in a lower package of a package on package.

Moreover, the present invention provides a method for manufacturing a substrate with a cavity that can reduce the thickness of a package on package substrate having at least 3 layers.

In addition, the present invention provides a method for manufacturing a substrate with a cavity that can reduce the manufacturing cost by eliminating the need for an additional cavity-forming process.

The present invention also provides a method for manufacturing a substrate with a cavity that can form a microcircuit by plating a pattern using a modified semi-additive process (MSAP).

Furthermore, the present invention provides a method for manufacturing a substrate with a cavity that can improve the efficiency of a substrate manufacturing process by using both sides of a seed layer to manufacture the substrate with a cavity.

An aspect of the present invention features a method for manufacturing a substrate having a cavity. The method can comprise: (a) forming a first circuit pattern on both sides of a seed layer by use of a first dry film, the seed layer being for forming a circuit pattern on both sides; (b) laminating a second dry film on the first dry film on both sides of the seed layer, the thickness of the second dry film corresponding to the depth of the cavity to be formed; (c) laminating a dielectric layer on an area outside of where the cavity is to be formed on both sides of the seed layer, the thickness of the dielectric layer corresponding to the depth of the cavity to be formed; (d) laminating on the seed layer a copper foil laminated master having a second circuit pattern; and (e) forming the cavity by peeling off the first dry film and the second dry film after removing the seed layer.

The method can further comprise the step of laminating in the formed cavity a bonding pad for electrically connecting an element and the substrate, by use of electrolytic plating or electroless plating.

The seed layer can be aluminum or nickel.

The step (a) can further comprise (f) forming the first circuit pattern by use of a modified semi-additive process (MSAP).

The step (b) can further comprise exposing and developing a dry film on an area excluding where the second dry film is laminated.

In the step (c), the dielectric layer can be a prepreg.

The method can further comprise (g) forming a via hole for electrically connecting the first circuit pattern and the second circuit pattern.

The seed layer can be a double-sided adhesive.

The seed layer can be two panels coupled by use of a rivet.

The seed layer can comprise two panels, and the two panels can be coupled to each other through corners.

The seed layer can comprises two panels, and the two panels can be coupled to each other through corners and a part of a middle area.

The seed layer can comprise two panels, and the two panels can be coupled to each other through a part of a middle area.

BRIEF DESCRIPTION OF THE DRAWINGS

These and other features, aspects, and advantages of the present invention will become better understood with regard to the following description, appended claims, and accompanying drawings where:

DETAILED DESCRIPTION OF CERTAIN INVENTIVE EMBODIMENTS

Hereinafter, preferred embodiments of the method for manufacturing a substrate with a cavity will be described in detail with reference to the accompanying drawings. In referencing the accompanying drawings, identical elements are given the same reference numerals, regardless of their figure numbers, and any redundant description thereof will be omitted. In addition, prior to describing preferred embodiments of the present invention, the method for manufacturing a general substrate will be described first. Although the method for manufacturing a multi-layer substrate is described, the present invention is by no means restricted to the method for manufacturing a multi-layer substrate.

First, an internal circuit pattern is formed on the outside of a core layer. An inner-layer base material that meets the product specification is cut, and a predetermined internal circuit pattern is formed using a dry film and a working film. Here, the inner layer can be scrubbed, and an inner layer dry film can be laminated, and the inner layer can be exposed/developed.

Then, prior to bonding the inner layer, on which the circuit pattern is formed, to the outer layer, a brown (black) oxide process is carried out in order to strengthen the adhesion. That is, the surface of a copper foil is chemically oxidized to enhance the surface roughness such that the lamination results in better adhesion. Then, by laminating the inner-layer substrate and a prepreg, prelamination and lamination processes are carried out.

Then, the laminated inner layer substrate and the prepreg are vacuum pressed. It is possible that the laminated inner layer substrate and the prepreg are hot pressed or cool pressed, instead of being vacuum pressed.

The resin and copper foil are trimmed from the corners of the panel, and an X-ray target drilling process, in which a hole is made at a target guide mark on the inner layer circuit, is carried out in preparation of a drilling process.

Then, the drilling process is carried out for electric conduction between the layers of the substrate. Here, a computer numerical control (CNC) method can be used for the drilling process.

Then, the outer layer is coated with the dry film and the working film in order to form a circuit pattern, exposed to a light of a predetermined intensity for a predetermined duration, and the unirradiated areas are developed in an etching process. After examining the outer layer and measuring the scale, a solder resist exposure film is designed and manufactured. Then, a preprocess, such as brush polishing, in which the surface of copper foil is made rough such that the solder resist ink is better adhered to the substrate, is carried out. The solder resist is then coated; the solder resist is exposed using the solder resist exposure film, designed adaptively in the preceding process; the solder resist is removed in a development process; and a variety of postprocesses, including electric/final tests, are carried out.

Figure 2:
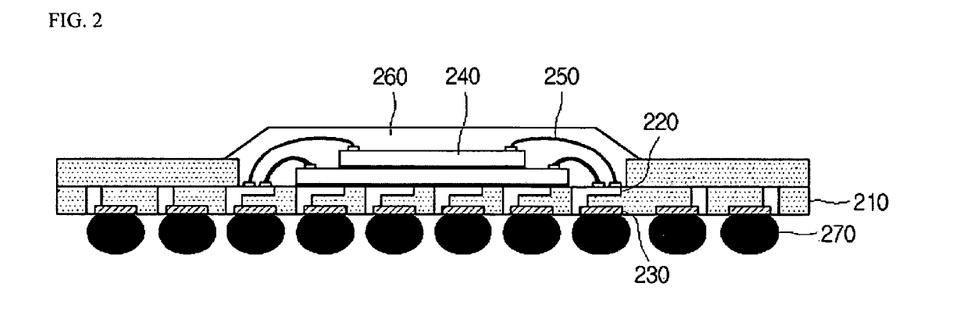
FIG. 2 shows a general illustration of a sectional view of a package on package in accordance with a preferred embodiment of the present invention.

FIG. 2 is a general illustration of the cut section of a semiconductor package, constituting a package on package, in accordance with a preferred embodiment of the present invention. Referring to FIG. 2, the semiconductor package in accordance with the present invention comprises a core layer 210, a conductive circuit 220, a metal pad 230, an integrated circuit 240, a metal wire 250, a molding part 260, and a solder ball 270.

According to the present invention, at least one integrated circuit 240 is seated and located in a cavity, which is formed on a substrate, in order to reduce the thickness of the semiconductor package. That is, the cavity is formed in the upper part of the core layer 210 of a package on package, using a dielectric layer, and the integrated circuit 240 is inserted in the formed cavity. Then, the integrated circuit 240 is electrically coupled to the conductive circuit 220 and the metal pad 230, using the metal wire 250. Using a protective material, such as epoxy resin, the molding part is formed around and on top of the integrated circuit 240.

Figure 3:
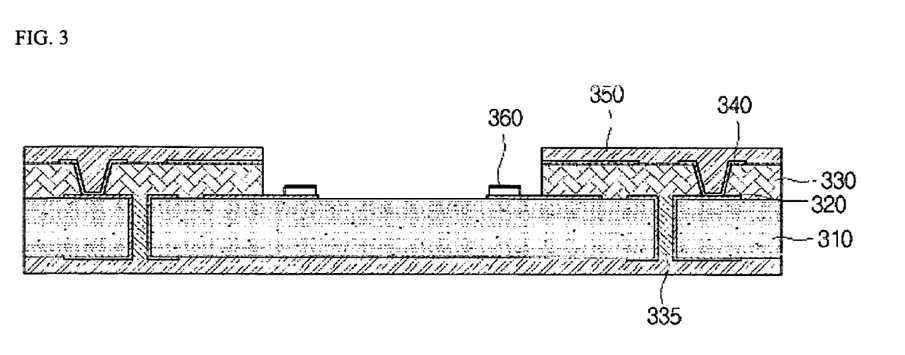
FIG. 3 shows a sectional view of a package on package in accordance with a preferred embodiment of the present invention.

FIG. 3 is a sectional view of a package on package in accordance with a preferred embodiment of the present invention. Referring to FIG. 3, the substrate in accordance with the present invention can comprise a core layer 310, an internal circuit 320, a dielectric layer 330, an interstitial via hole (IVH) 335, an external circuit 340, a solder resist 350, and a bonding pad 360.

The core layer 310 can be a copper foil laminated master, on which the internal circuit 320 is formed, and the dielectric layer 330 can be made of a dielectric material, such as a prepreg or a resin coated copper foil (RCC).

The internal circuit 320 and the external circuit 340 can be electrically connected to each other by the IVH 335 and the BVH. Here, the internal circuit 320 and the external circuit 340 can also be electrically connected to each other by a plated through hole (PTH, not shown).

The bonding pad 370 is seated in the cavity and connects a semiconductor chip and the substrate. The semiconductor chip and the substrate can be coupled to each other through flip-chip bonding or wire bonding.

FIGS. 4-10 illustrate the method for manufacturing the substrate, on which the cavity is formed, used for a package on package in accordance with a preferred embodiment of the present invention.

Figure 4:
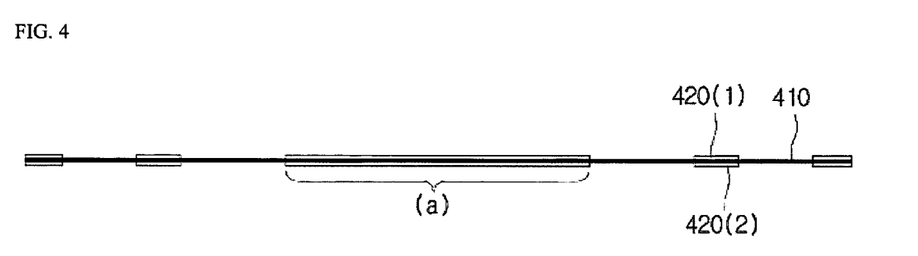
FIGS. 4-10 illustrate the method for manufacturing a substrate, on which a cavity is formed, used for a package on package in accordance with a preferred embodiment of the present invention.
Figure 5:
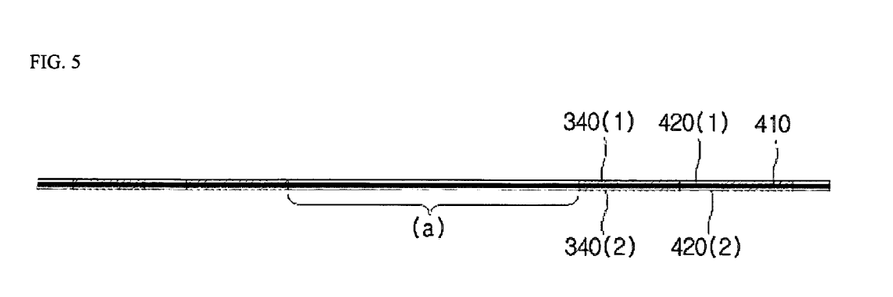

Referring to FIGS. 4 and 5, dry films (or first dry films) 420(1) and 420(2) are coated on a seed layer 410 in order to form a circuit on a dielectric layer, and certain circuit patterns (or first circuit patterns) 340(1) and 340(2) are formed. The seed layer 410 can be aluminum or nickel. The area (a), in which the cavity is to be formed, is predetermined. After the circuit pattern is formed, a pattern is plated through a modified semi-additive process (MSAP).

The semi-additive process forms a circuit pattern after forming a copper (Cu) seed layer through electroless plating, using a material that does not have a seed layer. That is, a plating resist is used on the surface of a copper foil, which is on the outer layer of a copper-clad laminate, and the plating resist in the area where the circuit is to be formed is peeled off through exposure and developing processes. As a result, the surface of the outer copper foil becomes exposed, and the plating resist of only the area where the circuit is not to be formed remains on the outer layer of the copper foil. By copper-plating on the surface, the plating resist is peeled off to form a copper plated circuit layer on the surface of the exposed outer copper foil, thereby forming a circuit pattern. Once the plating is completed, the remaining plating resist is peeled off, and the copper foil between the wiring in the formed circuits is dissolved off using flush etching, thereby completing the printed circuit board. When the copper foil layer is removed through flush etching, the upper edge of the copper plated circuit layer becomes also eroded, deteriorating the shape of the final printed circuit board as well as the aspect ratio of the cross-section of the circuit. To avoid this, the following process can be also carried out: In the semi-additive method, the copper plated circuit layer and outer layer copper foil layer must have the Rv value, which is Vsc/Vsp, of 1.0 or higher, whereas Vsp is the dissolving speed of the extracted copper constituting the copper plated circuit layer, and Vsc is the dissolving speed of the copper constituting the outer layer copper foil layer. The modified semi-additive process forms a circuit pattern using a material on which copper is laminated from the beginning, that is, a material having a seed layer. The rest of the process is identical to the above semi-additive process. For the seed layer of the present invention, nickel or aluminum can be used. Thus, since the materials for the seed layer and the circuit are different from each other, the seed layer can be selectively etched.

Figure 6:
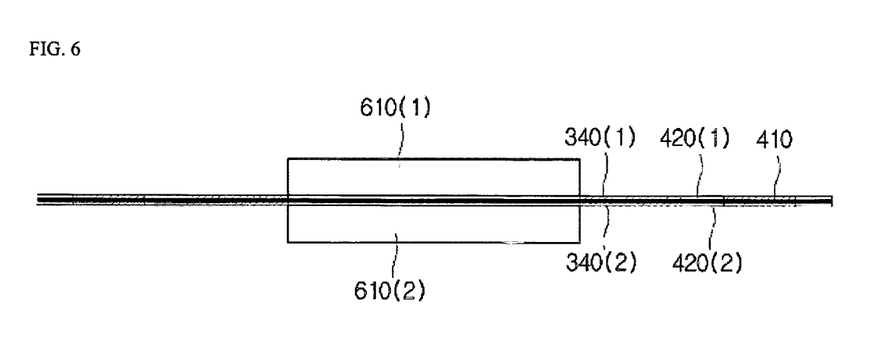

Referring to FIG. 6, dry films (or second dry films) 610(1) and 610(2), which are thicker (the thickness corresponding to the height of the cavity to be formed) than the dry films used for pattern plating, are laminated after the pattern plating, and then the area outside (a), where the cavity is to be formed, is developed.

Figure 7:
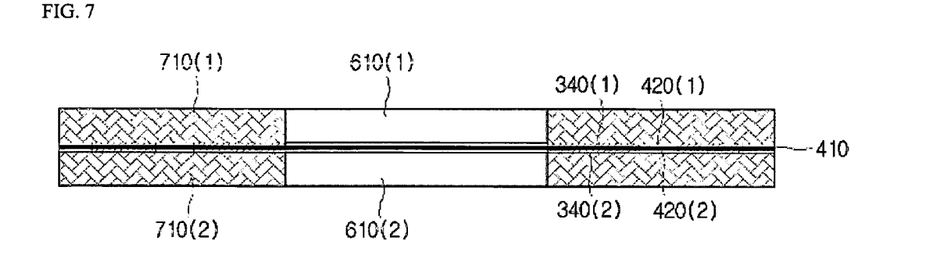

Referring to FIG. 7, to form dielectric layers 710(1) and 710(2), a prepreg or bonding sheet is deposited and laid up in accordance with the height of the dry films 610(1) and 610(2) coated in the area where the cavity is to be formed. Here, a pre-process can be done in order to increase the adhesion between the plated pattern and the dielectric layers 710(1) and 710(2).

Figure 8:
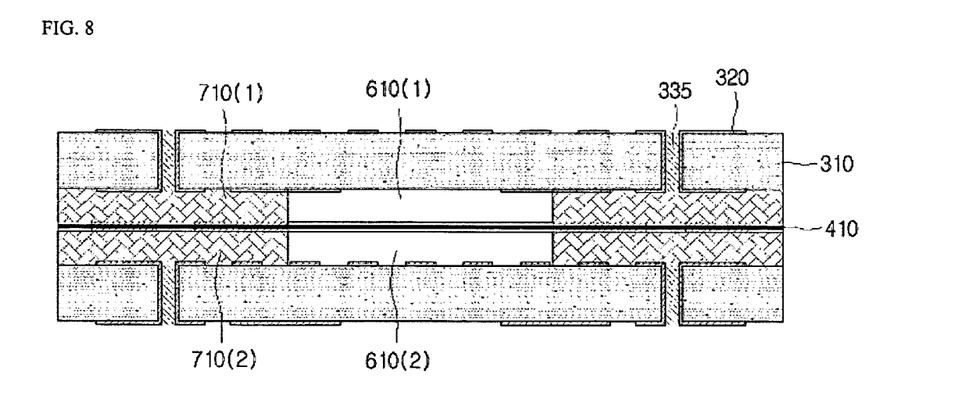

Referring to FIG. 8, a copper foil laminated master 310, on which a circuit pattern (or a second circuit pattern) 320 is formed, is deposited on each of the dielectric layers 710(1) and 710(2). Here, the copper foil laminated master 310 is deposited on the dielectric layers 710(1) and 710(2) and the first and second dry films 610(1), 610(2), 420(1), and 420(2). That is, the copper foil laminated master 310, on which the second circuit pattern 320 is formed, is deposited such that the first and second dry films 610(1), 610(2), 420(1), and 420(2) and the seed layer 410 are contained. In order to prevent the dielectric layers 710(1) and 710(2) from flowing out through the IVH 335, the copper foil laminated master 310, on which the second circuit pattern is formed, is laminated on the dielectric layers 710(1) and 710(2) after the IVH 335 is plugged.

Figure 9:
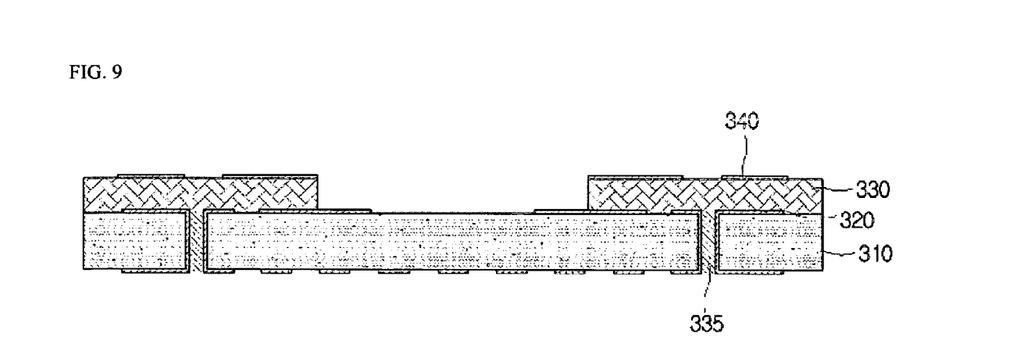

Referring to FIG. 9, after depositing the copper foil laminated master 310, on which the circuit pattern (or the second circuit pattern) 320 is formed, on each of the dielectric layers 710(1) and 710(2), the aluminum or nickel, which worked as the seed layer 410, is etched off using an etching solution, and the dry films are peeled off, thereby forming the cavity. The dry films can be peeled off using an NaOH solution. Hence, by removing one seed layer 410, two substrates, which are stacked on both sides of the seed layer 410, can be produced.

Figure 10:
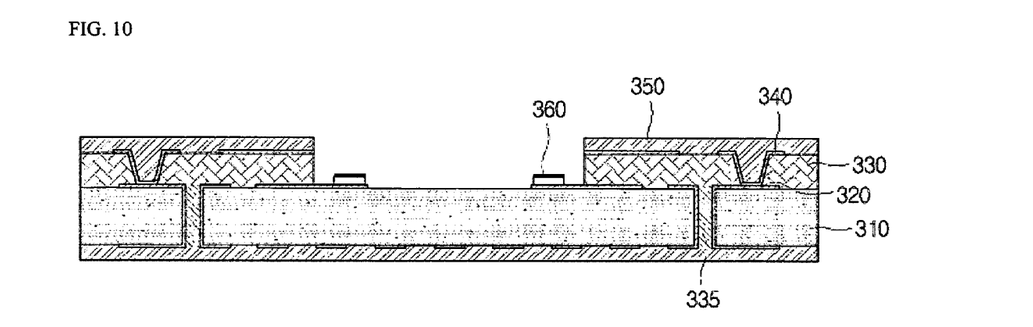

Referring to FIG. 10, a blind via hole (BVH) is formed using a laser drill in order to electrically connect the upper and lower layers (the first and second circuit patterns) after the lamination is completed. Then, plating is carried out for electrical conduction. A photoresist process can be introduced later for the protection of the circuit. By forming a bonding pad 360 through electroless plating or electrolytic plating, the manufacturing of the substrate is completed.

So far, the sectional views of a general method for manufacturing a substrate on which a cavity is formed have been described. Hereinafter, certain embodiments of the method for manufacturing a substrate on which a cavity is formed in accordance with the present invention will be described with reference to the accompanying drawings. Described below are 6 embodiments of the present invention, based on the shape of the seed layer used in manufacturing the substrate with a cavity.

Figure 11:
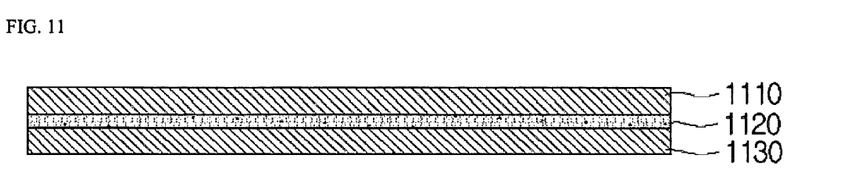
FIG. 11 shows a sectional view of a seed layer used in manufacturing a substrate, on which a cavity is formed, in accordance with a first preferred embodiment of the present invention.

FIG. 11 is a sectional view of the seed layer used in manufacturing the substrate with a cavity in accordance with a first embodiment of the present invention. Referring to FIG. 11, a first seed layer 1110, a double-sided adhesive 1120, and a second seed layer 1130 are illustrated. Hereinafter, the first seed layer 1110 and the second seed layer 1130 can be collectively referred to as a panel.

The first seed layer 1110 and the second seed layer 1130 are coupled to each other by the double-sided adhesive 1120. After stacking the substrate with a cavity in accordance with the present invention on the first seed layer 1110 and the second seed layer 1130, the first seed layer 1110 and the second seed layer 1130, which are coupled by the double-sided adhesive 1120, are separated. Then, by etching the first seed layer 1110 and the second seed layer 1130, the cavity in accordance with the present invention can be formed.

Figure 12:
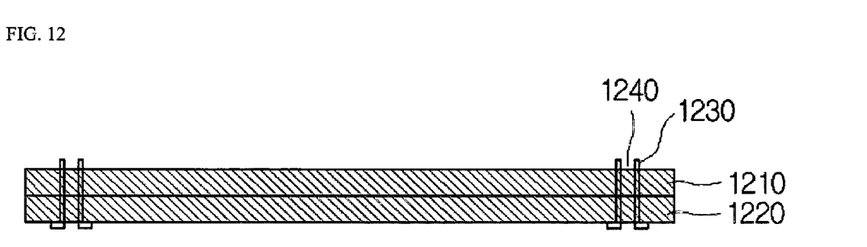
FIG. 12 shows a sectional view of a seed layer used in manufacturing a substrate, on which a cavity is formed, in accordance with a second preferred embodiment of the present invention.

FIG. 12 is a sectional view of the seed layer used in manufacturing the substrate with a cavity in accordance with a second embodiment of the present invention. Referring to FIG. 12, a first seed layer 1210, a second seed layer 1220, a rivet 1230, and a rivet gap 1240 are illustrated.

The first seed layer 1210 and the second seed layer 1220 are coupled to each other by the rivet 1230. After stacking the substrate with a cavity in accordance with the present invention on the first seed layer 1210 and the second seed layer 1220, the first seed layer 1210 and the second seed layer 1220 are separated by removing the rivet 1230. Then, by etching the first seed layer 1210 and the second seed layer 1220, the cavity in accordance with the present invention can be formed. The material used for the rivet 1230 can be the same as that of the panel. Therefore, if the rivet 1230 is also dissolved by the etching solution, the etching solution can be easily permeated to the interface of the panel, facilitating easier separation. If the panel is larger than the substrate, there can be enough room to position the rivet 1230 around the border.

Figure 13:
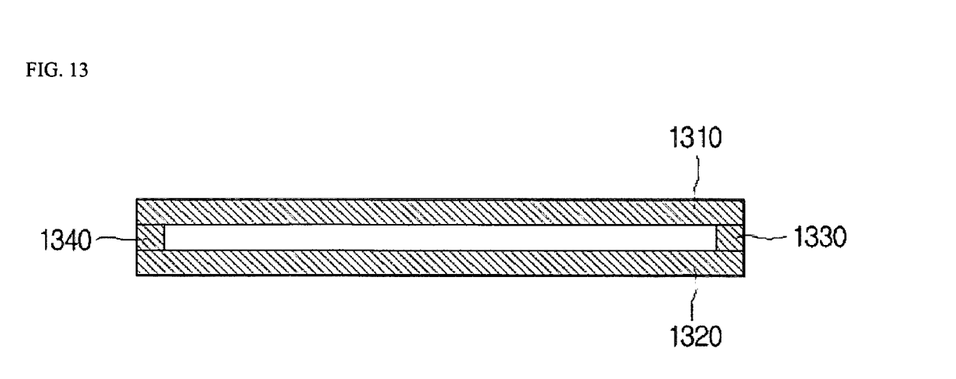
FIG. 13 shows a sectional view of a seed layer used in manufacturing a substrate, on which a cavity is formed, in accordance with a third preferred embodiment of the present invention.

FIG. 13 is a sectional view of the seed layer used in manufacturing the substrate with a cavity in accordance with a third embodiment of the present invention. Referring to FIG. 13, a first seed layer 1310, a second seed layer 1320, and corner coupling parts 1330 and 1340 are illustrated.

The first seed layer 1310 and the second seed layer 1320 are coupled to each other by the corner coupling parts 1330 and 1340. After stacking the substrate with a cavity in accordance with the present invention on the first seed layer 1310 and the second seed layer 1320, the first seed layer 1310 and the second seed layer 1320 are separated by etching off the corner coupling parts 1330 and 1340. Then, by etching the first seed layer 1310 and the second seed layer 1320, the cavity in accordance with the present invention can be formed. By removing the corner coupling parts 1330 and 1340 first, the first seed layer 1310 and the second seed layer 1320 can be etched easily. The material used for the corner coupling parts 1330 and 1340 can be the same as that of the panel. Therefore, if the corner coupling parts 1330 and 1340 are also dissolved by the etching solution, the etching solution can be easily permeated to the interface of the panel, facilitating easier separation.

Figure 14:
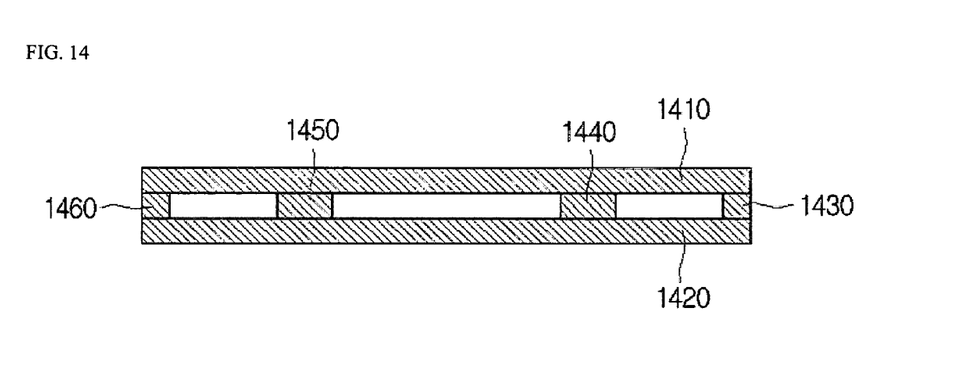
FIG. 14 shows a sectional view of a seed layer used in manufacturing a substrate, on which a cavity is formed, in accordance with a fourth preferred embodiment of the present invention.

FIG. 14 is a sectional view of the seed layer used in manufacturing the substrate with a cavity in accordance with a fourth embodiment of the present invention. Referring to FIG. 14, a first seed layer 1410, a second seed layer 1420, corner coupling parts 1430 and 1460, and middle area coupling parts (or inner coupling parts) 1440 and 1450 are illustrated.

The first seed layer 1410 and the second seed layer 1420 are coupled to each other by the corner coupling parts 1430 and 1460 and the middle area coupling parts 1440 and 1450. After stacking the substrate with a cavity in accordance with the present invention on the first seed layer 1410 and the second seed layer 1420, the first seed layer 1410 and the second seed layer 1420 are separated by etching off the corner coupling parts 1430 and 1460 and the middle area coupling parts 1440 and 1450. Then, by etching the first seed layer 1410 and the second seed layer 1420, the cavity in accordance with the present invention can be formed. Since the space inside is hollow in this case, the warpage, which is possible in the third embodiment, can be minimized.

Figure 15:
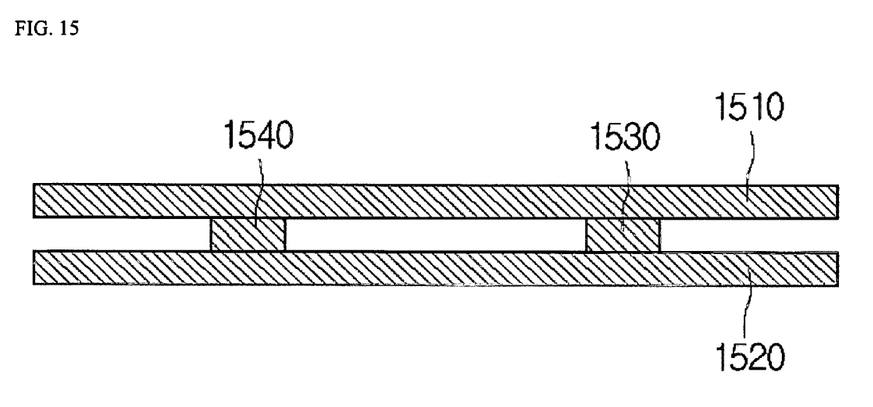
FIG. 15 shows a sectional view of a seed layer used in manufacturing a substrate, on which a cavity is formed, in accordance with a fifth preferred embodiment of the present invention.

FIG. 15 is a sectional view of the seed layer used in manufacturing the substrate with a cavity in accordance with a fifth embodiment of the present invention. Referring to FIG. 15, a first seed layer 1510, a second seed layer 1520, and middle area coupling parts (or inner coupling parts) 1530 and 1540 are illustrated.

The first seed layer 1510 and the second seed layer 1520 are coupled to each other by the middle area coupling parts 1530 and 1540. After stacking the substrate with a cavity in accordance with the present invention on the first seed layer 1510 and the second seed layer 1520, the first seed layer 1510 and the second seed layer 1520 are separated by etching off the middle area coupling parts 1530 and 1540. Then, by etching the first seed layer 1510 and the second seed layer 1520, the cavity in accordance with the present invention can be formed. In this case, it is possible to carry out the etching after taping the edge (in order to prevent the inside from being plated). As a result, the edge does not need to be cut, and the warpage caused by the inner coupling parts can be prevented during the stacking.

Figure 16:
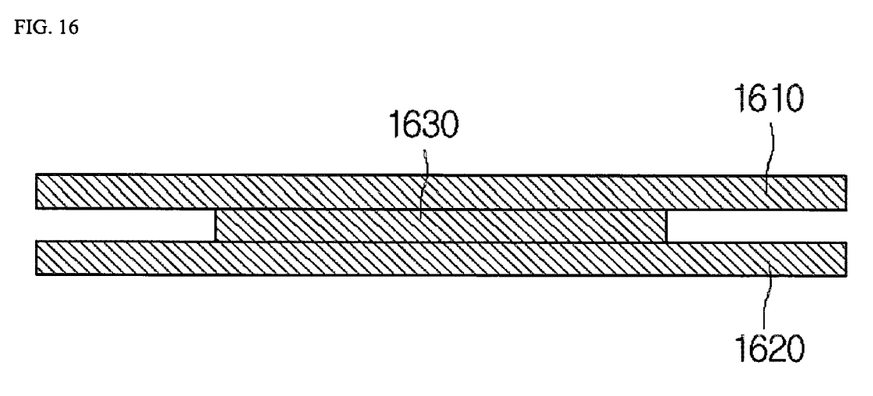
FIG. 16 shows a sectional view of a seed layer used in manufacturing a substrate, on which a cavity is formed, in accordance with a sixth preferred embodiment of the present invention.

FIG. 16 is a sectional view of the seed layer used in manufacturing the substrate with a cavity in accordance with a sixth embodiment of the present invention. Referring to FIG. 16, a first seed layer 1610, a second seed layer 1620, and a middle area coupling part 1630 are illustrated.

The first seed layer 1610 and the second seed layer 1620 are coupled to each other by the middle area coupling part 1630. After stacking the substrate with a cavity in accordance with the present invention on the first seed layer 1610 and the second seed layer 1620, the first seed layer 1610 and the second seed layer 1620 are separated by etching off the middle area coupling part 1630. Then, by etching the first seed layer 1610 and the second seed layer 1620, the cavity in accordance with the present invention can be formed. In this case, the warpage can be minimized by making the coupling part larger than those of the fifth embodiment.

As described above, the method for manufacturing a substrate with a cavity in accordance with the present invention can mount a plurality of integrated circuits by reducing the thickness of the substrate in a package on package substrate.

The method for manufacturing a substrate with a cavity in accordance with the present invention can also reduce the overall thickness of the semiconductor package by mounting the integrated circuits in the cavity.

Moreover, the method for manufacturing a substrate with a cavity in accordance with the present invention can simplify the process by mounting the integrated circuits in the cavity formed on the substrate, without using a separate drilling process.

Furthermore, the method for manufacturing a substrate with a cavity in accordance with the present invention can make the package relatively thinner than other packages, on which the same number of integrated circuits are mounted, by incorporating the integrated circuits in the cavity formed on the substrate.

In addition, the method for manufacturing a substrate with a cavity in accordance with the present invention allows a better finishing process than the conventional cavity-forming process by forming the cavity without using a separate drilling process.

Besides, the method for manufacturing a substrate with a cavity in accordance with the present invention can mount multiple layers of a plurality of integrated circuits in a lower package of a package on package.

The method for manufacturing a substrate with a cavity in accordance with the present invention can reduce the thickness of a package on package substrate having at least 3 layers.

The method for manufacturing a substrate with a cavity in accordance with the present invention can reduce the manufacturing cost by eliminating the need for an additional cavity-forming process.

Also, the method for manufacturing a substrate with a cavity in accordance with the present invention can form a microcircuit by plating a pattern using a modified semi-additive process (MSAP).

Furthermore, the method for manufacturing a substrate with a cavity in accordance with the present invention can improve the efficiency of a substrate manufacturing process by using both sides of a seed layer to manufacture the substrate with a cavity.

Although certain preferred embodiments of the present invention have been described, anyone of ordinary skill in the art to which the invention pertains should be able to understand that a large number of modifications and permutations are possible within the spirit and scope of the invention and its equivalents, which shall only be defined by the claims, appended below.

What is claimed is:

1. A method for manufacturing a substrate, the substrate having a cavity, the method comprising:

forming a first circuit pattern on both sides of a seed layer by use of a first dry film, the first dry film is formed on both sides of the seed layer in order to form the first circuit pattern;

laminating a second dry film on the first dry film on both sides of the seed layer, the thickness of the second dry film corresponding to the depth of the cavity to be formed;

laminating a dielectric layer on an area that is surrounding the second dry film on both sides of the seed layer, the thickness of the dielectric layer corresponding to the depth of the cavity to be formed;

laminating on the dielectric layer and a second dry film a copper foil laminated master having a second circuit pattern; and forming the cavity by peeling off the first dry film and the second dry film from the dielectric layer and copper foil laminated master, respectively, after removing the seed layer from the first dry film and the first circuit pattern.

2. The method of claim 1, further comprising laminating in the formed cavity a bonding pad for electrically connecting an element and the substrate, by use of electrolytic plating or electroless plating.

3. The method of claim 1, wherein the seed layer is aluminum or nickel.

4. The method of claim 1, wherein the forming first circuit pattern further comprises forming the first circuit pattern by use of a modified semi-additive process (MSAP).

5. The method of claim 1, wherein the laminating the second dry film further comprises exposing and developing a dry film on an area excluding where the second dry film is laminated.

6. The method of claim 1, wherein, in the laminating the dielectric layer, the dielectric layer is a prepreg.

7. The method of claim 1, further comprising forming a via hole for electrically connecting the first circuit pattern and the second circuit pattern.

8. The method of claim 1, wherein the seed layer is a double-sided adhesive.

9. The method of claim 1, wherein the seed layer is two panels coupled by use of a rivet.

10. The method of claim 1, wherein the seed layer comprises two panels, and the two panels are coupled to each other through corners.

11. The method of claim 1, wherein the seed layer comprises two panels, and the two panels are coupled to each other through corners and a part of a middle area.

12. The method of claim 1, wherein the seed layer comprises two panels, and the two panels are coupled to each other through a part of a middle area.

* * * * *

UNITED STATES PATENT AND TRADEMARK OFFICE
CERTIFICATE OF CORRECTION

PATENT NO.         : 7,562,446 B2                                                                Page 1 of 1
APPLICATION NO.    : 11/524403
DATED              : July 21, 2009
INVENTOR(S)        : Hoe-Ku Jung et al.

It is certified that error appears in the above-identified patent and that said Letters Patent is hereby corrected as shown below:

Title Page, Column 2 Item [57] (Abstract), Line 3, change "patter" to --pattern--.

Signed and Sealed this

Fifth Day of January, 2010

David J. Kappos
*Director of the United States Patent and Trademark Office*